(12) United States Patent
Jin

(10) Patent No.: US 12,154,799 B2
(45) Date of Patent: Nov. 26, 2024

(54) SUSCEPTOR FOR HIGH-TEMPERATURE USE HAVING SHAFT WITH LOW THERMAL CONDUCTIVITY

(71) Applicant: MiCo Ceramics Ltd., Gyeonggi-do (KR)

(72) Inventor: Jung Chul Jin, Gyeonggi-do (KR)

(73) Assignee: MiCo Ceramics Ltd., Gyeonggi-do (KR)

( * ) Notice: Subject to any disclaimer, the term of this patent is extended or adjusted under 35 U.S.C. 154(b) by 0 days.

(21) Appl. No.: 17/902,420

(22) Filed: Sep. 2, 2022

(65) Prior Publication Data
US 2023/0088822 A1   Mar. 23, 2023

(30) Foreign Application Priority Data
Sep. 17, 2021   (KR) .................. 10-2021-0124972

(51) Int. Cl.
 *H01L 21/67* (2006.01)
 *H01L 21/687* (2006.01)
 *H05B 3/14* (2006.01)

(52) U.S. Cl.
 CPC .. *H01L 21/67103* (2013.01); *H01L 21/68785* (2013.01); *H01L 21/68792* (2013.01); *H05B 3/143* (2013.01)

(58) Field of Classification Search
 CPC ...................... H05B 2203/009; H05B 2203/01
 USPC ...................................................... 219/444.1
 See application file for complete search history.

(56) References Cited

U.S. PATENT DOCUMENTS

| | | | | |
|---|---|---|---|---|
| 4,618,592 A | * | 10/1986 | Kuramoto | ............. C04B 35/581 501/96.3 |
| 4,997,798 A | * | 3/1991 | Okuno | ................ H01L 23/3731 257/E23.113 |
| 5,677,253 A | * | 10/1997 | Inoue | .................... C04B 35/581 501/98.5 |
| 6,239,402 B1 | | 5/2001 | Araki et al. | |
| 2002/0023914 A1 | * | 2/2002 | Kitagawa | ............... H05B 3/143 219/468.1 |

(Continued)

FOREIGN PATENT DOCUMENTS

| | | |
|---|---|---|
| CN | 106653652 A | 5/2017 |
| CN | 110709983 A | 1/2020 |

(Continued)

OTHER PUBLICATIONS

Office Action from corresponding Korean Patent Application No. 10-2021-0124972, issued on May 9, 2022.

(Continued)

*Primary Examiner* — Sang Y Paik
(74) *Attorney, Agent, or Firm* — Harness, Dickey & Pierce, P.L.C.

(57) ABSTRACT

Disclosed is a susceptor for high-temperature use having a shaft with low thermal conductivity, wherein in a susceptor including a plate for wafer mounting and a shaft coupled to the plate, the plate and the shaft each include a sintered body having 90 wt % or more of an AlN phase, the sintered body of the plate is a magnesium-containing AlN sintered body having a volume resistance of $5*10^8$ Ω·cm or more at 650° C., and the sintered body of the shaft is an AlN sintered body having a room-temperature thermal conductivity of 100 W/mK or less.

5 Claims, 5 Drawing Sheets

(56) References Cited

U.S. PATENT DOCUMENTS

| | | |
|---|---|---|
| 2004/0175549 A1 | 9/2004 | Ito |
| 2005/0045618 A1* | 3/2005 | Ito .................... C04B 35/62655 219/548 |
| 2006/0213900 A1 | 9/2006 | Matsuda et al. |
| 2006/0217259 A1* | 9/2006 | Teratani ................ C04B 35/645 501/98.5 |
| 2010/0297410 A1 | 11/2010 | Subramanian |
| 2013/0319762 A1 | 12/2013 | Harris et al. |
| 2014/0079946 A1 | 3/2014 | Jindo et al. |
| 2019/0292105 A1 | 9/2019 | Yagi et al. |
| 2020/0090964 A1 | 3/2020 | Unno et al. |
| 2020/0303205 A1 | 9/2020 | Chae et al. |

FOREIGN PATENT DOCUMENTS

| | | |
|---|---|---|
| CN | 110770193 A | 2/2020 |
| JP | H11157951 A | 6/1999 |
| JP | 2000-044345 A | 2/2000 |
| JP | 2002-220282 A | 8/2002 |
| JP | 2003-142564 A | 5/2003 |
| JP | 2003-226580 A | 8/2003 |
| JP | 2003-264120 A | 9/2003 |
| JP | 2004128232 A | 4/2004 |
| JP | 2006-269826 A | 10/2006 |
| JP | 4311922 B2 | 8/2009 |
| JP | 2010-241609 A | 10/2010 |
| JP | 2015-514661 A | 5/2015 |
| JP | 2015-164882 A | 9/2015 |
| JP | 2017-085087 A | 5/2017 |
| JP | 2019-167288 A | 10/2019 |
| JP | 2020-521706 A | 7/2020 |
| KR | 10-2004-0030803 A | 4/2004 |
| KR | 10-2014-0035834 A | 3/2014 |
| KR | 10-2014-0132903 A | 11/2014 |
| KR | 10-2242589 B1 | 4/2021 |
| TW | 201904916 A | 2/2019 |

OTHER PUBLICATIONS

Notice of Allowance from corresponding Korean Patent Application No. 10-2021-0124972, issued on Jul. 26, 2022.

Office Action from corresponding Japanese Application No. 2022-144114, dated Nov. 15, 2022.

Office Action from correpsonding Taiwan Application No. 111134164, dated Nov. 22, 2022.

Office Action from corresponding Chinese Patent Application No. 202211104124.5, dated Feb. 25, 2023.

* cited by examiner

SUSCEPTOR FOR HIGH-TEMPERATURE USE HAVING SHAFT WITH LOW THERMAL CONDUCTIVITY

CROSS-REFERENCE TO RELATED APPLICATION

This application claims the benefit and priority to Korean Patent Application No. 10-2021-0124972, filed on Sep. 17, 2021. The entire disclosures of the applications identified in this paragraph are incorporated herein by references.

FIELD

The present disclosure relates to a susceptor and a manufacturing method therefor and to a susceptor for high-temperature use having a shaft with low thermal conductivity and a manufacturing method therefor.

BACKGROUND

In a semiconductor device manufacturing process, a semiconductor wafer, a target of processing, is subjected to various types of processing, such as film formation processing and etching processing. A semiconductor manufacturing apparatus for use in such processing performed on a semiconductor wafer employs a susceptor as a member for supporting the semiconductor wafer.

The susceptor includes: a plate for supporting a wafer, the plate being formed of a ceramic material, such as aluminum nitride; and a shaft for supporting the plate in a chamber for semiconductor manufacturing.

FIG. 1 is a view schematically showing a structure of a conventional susceptor.

Referring to FIG. 1, a susceptor 1 includes a plate 10 for supporting a substrate and a shaft 20 for supporting the plate.

The plate 10 may include a heating element (not shown) for heating a substrate or a temperature sensor (not shown). These components are connected to a power or a controller outside the susceptor via the inside of the shaft 20 by a connection unit, such as an electrode, an electrode rod, and/or terminal.

It is preferable that the plate 10 of the susceptor is implemented using a material with high thermal conductivity in order to, if possible, maintain the uniformity of temperature distribution (thermal uniformity) on the substrate supported by the susceptor and the shaft 20 supporting the plate is implemented using a material with low thermal conductivity.

For example, Japanese Patent No. 4311922 discloses a susceptor having a plate with a thermal conductivity of 80 W/mK or more and a shaft with a thermal conductivity of 20 W/mK or less. In such a case, aluminum nitride, silicon carbide, alumina, silicon nitride, or the like, which has comparatively high thermal conductivity, is used as a material for the plate, and alumina, silicon nitride, mullite, a mullite alumina composite, or the like, which has comparatively low thermal conductivity, is used as a material for the shaft. In the patent, an intermediate joint part is used to join the plate and the shaft, and this intermediate joint part reduces the stress on the shaft since the thermal stress occurring due to a difference in shape or thermal conductivity between the plate and the shaft is applied to the intermediate joint part. The intermediate joint part may be implemented using the same member as in the shaft or a material having intermediate thermal conductivity between the thermal conductivity of the plate and the thermal conductivity of the shaft.

However, such a conventional susceptor is difficult to use as a susceptor for substrate processing at a high temperature of 650° C. or higher due to several reasons. Above all, consideration should be given to the structure or material of a susceptor to cope with a leakage current or the like caused by a sharp decrease in the volume resistance of the plate at a high temperature of 650° C. or higher, but the conventional susceptor does not take this into consideration. Moreover, the conventional susceptor uses different materials in order to implement different levels of thermal conductivity for the plate, the shaft, and the intermediate joint part, and thus cannot avoid the occurrence of thermal stress due to a difference in coefficient of thermal expansion during repeated heat treatment at high temperatures.

Moreover, the conventional susceptor is inevitably weak in heat resistance, corrosion resistance, mechanical properties, and the like at high temperatures since a large amount of active metallic or glassy phase binder is added to join the plate and the shaft.

PRIOR ART DOCUMENT

Patent Document (Patent Document 1) Japanese Patent No. 4311922

SUMMARY

The present disclosure has been made in order to solve the above-mentioned problems in the conventional art and an aspect of the present disclosure is to provide a susceptor structure suitable for wafer supporting in a high-temperature semiconductor processing process at 650° C. or higher.

Another aspect of the present disclosure is to provide an aluminum nitride-based susceptor structure, of which a plate and a shaft have similar coefficients of thermal expansion during heat treatment in a susceptor manufacturing process and a semiconductor processing process.

Still another aspect of the present disclosure is to provide a novel susceptor joint structure including a plate with high volume resistance and a shaft with low thermal conductivity suitable for supporting the plate.

Still another aspect of the present disclosure is to provide a susceptor structure having high mechanical characteristics even in a high-temperature processing process at 650° C. or higher.

Still another aspect of the present disclosure is to provide methods for manufacturing the above-described susceptor structure and joint structure.

In accordance with an aspect of the present disclosure, there is provided a susceptor including a plate for wafer mounting and a shaft coupled to the plate, wherein the plate and the shaft each include a sintered body having 90 wt % or more of an AlN phase, the sintered body of the plate is a magnesium-containing AlN sintered body having a volume resistance of $5*10^8$ Ω·m or more at 650° C., and the sintered body of the shaft is an AlN sintered body having a room-temperature thermal conductivity of 100 W/mK or less.

In the present disclosure, the sintered body of the plate may contain 0.05-3.0 wt % of magnesium in terms of MgO. In addition, the sintered body of the plate may contain 0.05-0.5 wt % of titanium in terms of $TiO_2$.

In the present disclosure, the susceptor may further include a buffer member interposed between the plate and the shaft.

The buffer member may be 90 wt % or more of an AlN phase in a sintered body thereof, and may contain 3-8 wt % of yttrium in terms of $Y_2O_3$.

In the present disclosure, the buffer member may have a blanket, ring, or circle shape.

In the present disclosure, when the average particle sizes of AlN grains in the sintered bodies of the plate, buffer member, and shaft are a first average particle size, a second average particle size, and a third average particle size, respectively, a relationship may be established in which the first average particle size<the second average particle size<the third average particle size.

In accordance with another aspect of the present disclosure, there is provided a method for manufacturing a susceptor, the method including: providing a laminated structure with a plate of a magnesium-containing AlN sintered body, a buffer member of an yttrium-containing AlN pre-sintered or sintered body, and a shaft of an AlN sintered body having a thermal conductivity of 100 W/mK or less; and sintering the laminated structure.

In the providing of the laminated structure of the present disclosure, the buffer member may be an AlN sintered body and the plate and the buffer member may be provided in an integrally sintered state.

In such a case, the sintered body of the plate may contain 0.5-3.0 wt % of magnesium in terms of MgO and may contain 0.05-0.5 wt % of Ti in terms of $TiO_2$.

In the providing of the laminated structure of the present disclosure, the buffer member may contain 3-8 wt % of yttrium in terms of yttrium oxide.

In addition, in the providing of the laminated structure, when the average particle sizes of AlN grains in the sintered bodies of the plate, buffer member, and shaft are a first average particle size, a second average particle size, and a third average particle size, respectively, a relationship may be established in which the first average particle size<the second average particle size<the third average particle size.

According to the present disclosure, a susceptor structure can be provided having a wafer-supporting plate, which has high volume resistance in a high-temperature semiconductor processing process at 650° C. or higher.

Furthermore, according to the present disclosure, the thermal stress occurring in a joint structure of a susceptor can be minimized by allowing a plate and a shaft to have similar coefficients of thermal expansion during heat treatment in a susceptor manufacturing process and a semiconductor processing process.

Furthermore, the present disclosure can provide a favorable joint structure between a plate with high volume resistance and a shaft with low thermal conductivity.

DETAILED DESCRIPTION

Figure 1:
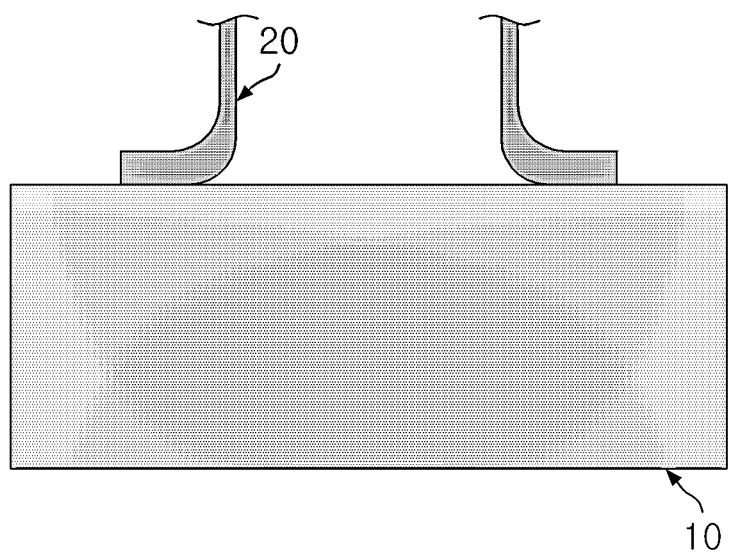
FIG. 1 is a view schematically showing a structure of a conventional susceptor for high-temperature use.

Hereinafter, the present invention will be described in detail with reference to the accompanying drawings. In each drawing, like components are denoted by like reference numerals. Further, the detailed description of known functions and/or components will be omitted. The following disclosed contents mainly describe portions required to understand operations according to embodiments and the description of elements which make the gist of the description obscure will be omitted. Further, some of components of the drawings may be exaggerated, omitted, or schematically illustrated. A size of each component does not completely reflect a real size and therefore the contents disclosed herein are not limited by a relative size or interval of the components illustrated in the drawings.

As used herein, the term "lamination" is used to refer to the relative positional relationship of each layer. The expression "Layer B on Layer A" refers to the relative positional relationship between Layer A and Layer B, which does not necessarily require the contact between Layer A and Layer B, and a third layer may be interposed therebetween. Similarly, the expression "Layer C interposed between Layer A and Layer B" does not exclude the interposition of a third layer between Layer A and Layer C or between Layer B and Layer C.

Figure 2:
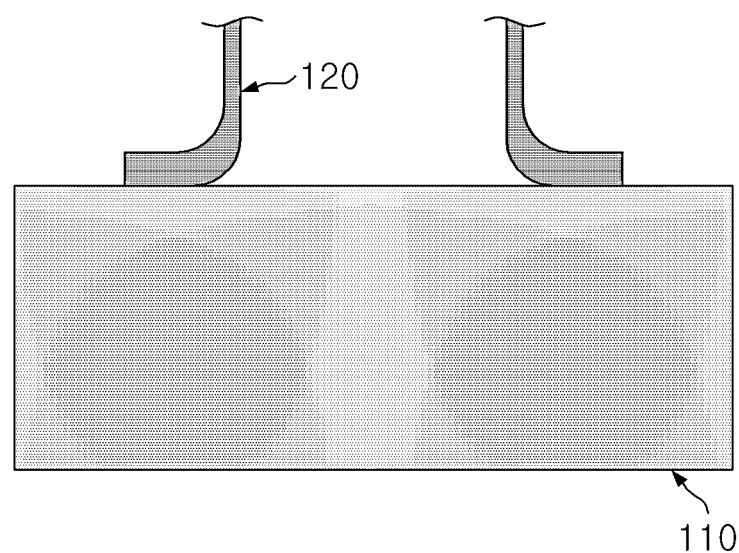
FIG. 2 is a cross-sectional view schematically showing a joint structure of a susceptor according to an embodiment of the present disclosure.

FIG. 2 is a cross-sectional view schematically showing a structure of a susceptor 100 according to an embodiment of the present disclosure.

Referring to FIG. 2, a shaft 120 is coupled to one surface of a plate 110.

In FIG. 2, the plate 110 and the shaft 120 each include a ceramic sintered body. Preferably, each sintered body in the present disclosure may include a sintered body containing aluminum nitride (AlN) as a main phase. Herein, the sintered body refers to a base material of each part. For example, the plate may further include inclusions, such as metallic hot wires or metallic mesh nets attached to the surface thereof or installed therein, but the sintered body of the plate herein refers to a base material, which is a homogeneous portion excluding the above-mentioned heterogeneous elements.

In the sintered body of the present disclosure, the AlN phase refers to a phase having an AlN crystal structure, and may include one in which a trace amount of impurities is in a substitutional or interstitial solid solution state in the AlN crystal structure. Herein, the aluminum nitride sintered body contains an AlN phase as a main phase but may partially contain an AlON phase (that is, $Al_{23}O_{27}N_5$). In the present disclosure, the AlON phase may be derived from a trace amount of oxygen contained in an AlN powder or artificially added $Al_2O_3$.

As described with respect to the AlN phase, the AlON phase may also include one in which a trace amount of impurities is in a substitutional or interstitial solid solution state in the crystal structure while its crystal structure is maintained.

In the present disclosure, the sintered body may contain additional phases in addition to the AlN and AlON phases. The additional phases are mainly due to the addition of a sintering aid. When, for example, MgO is used as a sintering aid, the sintered body may contain MgO or a spinel phase, such as $MgAl_2O_4$ or Mg—Al—O—N, as a secondary phase derived from MgO.

The constituent components of the susceptor of the present disclosure, for example, the plate or the shaft, additionally, the buffer member may be a sintered body containing an AlN phase as a main phase. The content of the AlN phase in these components may be 90 wt % or more, 92 wt % or more, or 95 wt % or more.

The plate 110 and the shaft 120 are common in that both include a sintered body containing an AlN phase as a main phase, but different in view of a specific composition and attribute.

The specific composition of the sintered body in the present disclosure may be adjusted according to the characteristics of each component. For example, the plate 110 is preferably high in the high-temperature volume resistance. The shaft 120 needs to have low thermal conductivity to suppress the heat loss of the plate. Therefore, the plate 110 and the shaft 120 may be designed to have different compositions.

The plate 110 in the present disclosure may be an aluminum nitride sintered body containing magnesium. The sintered body of the plate may further contain Ti. The added Mg or Ti greatly improves grain boundaries and intragranular resistance of the aluminum nitride sintered body, thereby enabling the sintered body to have a volume resistance of $\geq 0.5E^9$ $\Omega \cdot cm$, corresponding to a level at which the sintered body can be utilized in a high-temperature process at 650° C. The volume resistance of the plate in the present disclosure may be $0.5E^9$ $\Omega \cdot cm$ or more, $0.8E^9$ $\Omega \cdot cm$ or more, $1.0E^9$ $\Omega \cdot cm$ or more, or $5.0E^9$ $\Omega \cdot cm$ or more at 650° C.

This may be explained by the mechanism described below. The present disclosure may also be described by other mechanisms not described herein.

MgO added as a sintering aid reacts with oxygen contained in the AlN raw material powder to form a compound, such as Mg spinel. Therefore, the content of oxygen in a solid solution in the AlN lattice structure is reduced. When the content of oxygen as an impurity in a solid solution in the AlN lattice structure is reduced, aluminum vacancies generated by oxygen in a solid solution in the lattice are reduced in the AlN lattice structure, and thus the volume resistance is increased. On the other hand, a Mg compound, which may be formed by the addition of Mg, such as MgO or MgAl2O4, has a high volume resistance. Therefore, the precipitation of Mg compounds is low likely to have a negative effect on the volume resistance.

Meanwhile, $TiO_2$ added as a sintering aid combines with aluminum vacancies inside the AlN lattice, thereby preventing the aluminum vacancies in the lattice from contributing to ion conduction. Therefore, the volume resistance of the AlN grains increases.

The thermal conductivity of the AlN sintered body is reduced by the addition of MgO. This may be due to the low thermal conductivity of a grain boundary phase, such as spinel, precipitated by the addition of MgO. However, the plate is exposed to a high-temperature environment as it is in a high-temperature operating environment at 650° C. or higher, so that the thermal conductivity of the AlN material is reduced and the difference in thermal conductivity between compositional elements of AlN is gradually reduced, and as a result, the thermal conductivity does not act as a main factor in designing.

In the present disclosure, MgO and $TiO_2$ need to be added with the minimum limit or above so as to show an effective effect, and an appropriate amount needs to be added since the increasing addition amount may reach a saturation state.

For example, in the sintered body of the plate 110 of the present disclosure, the content of magnesium may be, in terms of MgO, 0.1 wt % or more, 0.5 wt % or more, or 1.0 wt % or more, and may be 3.0 wt % or less, 2.5 wt % or less, 2.4 wt % or less, 2.3 wt % or less, 2.2 wt % or less, 2.1 wt % or less, or 2.0 wt % or less.

In the sintered body of the plate 110, the content of Ti may be, in terms of $TiO_2$, 0.05 wt % or more, 0.1 wt % or more, 0.15 wt % or more, or 0.2 wt % or more. The content of Ti in the sintered body may be 0.5 wt % or less, 0.4 wt % or less, 0.3 wt % or less, or 0.25 wt % or less.

The shaft 120 of the present disclosure is composed of an AlN sintered body with low thermal conductivity.

The shaft 120 preferably has a thermal conductivity of 70-100 W/m·K at room temperature. The shaft 120 preferably has a thermal conductivity of 35-65 W/m·K at a temperature of 550° C. and a thermal conductivity of 30-60 W/m·K at a temperature of 650° C.

Exemplary ranges of thermal conductivity of the plate, buffer member, and shaft constituting the susceptor of the present disclosure are shown in Table 1 below.

TABLE 1

| Category | Thermal conductivity | Thermal conductivity (@RT) | Thermal conductivity (@550° C.) | Thermal conductivity (@650° C.) |
|---|---|---|---|---|
| Plate | Thermal conductivity (W/mK) | 50-80 | 25-55 | 20-50 |
| Buffer member | | 160-190 | 55-85 | 45-75 |
| Shaft | | 70-100 | 35-65 | 30-60 |

The AlN sintered body with low thermal conductivity of the present disclosure can be attained by adjusting the addition amount of a sintering aid. The oxygen in a solid solution in the AlN lattice lowers the thermal conductivity of AlN. Therefore, the suppression of the contents of alkaline earth metals such as Ca and Mg, rare earth metals such as yttrium (Y), and transition metals such as Ti, which are known as sintering aids, can maintain phonon scattering elements, such as oxygen and vacancies, in the lattice and can produce an AlN sintered body with low thermal conductivity. For example, the shaft may be an AlN sintered body containing 2 wt % or less of yttria as a sintering aid, and the thermal conductivity thereof may be controlled by the content of a sintering aid, such as yttria.

Alternately, the artificial introduction of impurities into AlN, for example, the addition of $Al_2O_3$, may be considered. However, such impurities may cause excessive generation of the AlON phase, resulting in a discrepancy in coefficient of thermal expansion between the shaft and the plate.

As another example, the content of an individual metal element in the sintered body may be maintained at 1000 ppm or less. In such a case, a shaft with a very low thermal conductivity can be implemented.

Figure 3A:
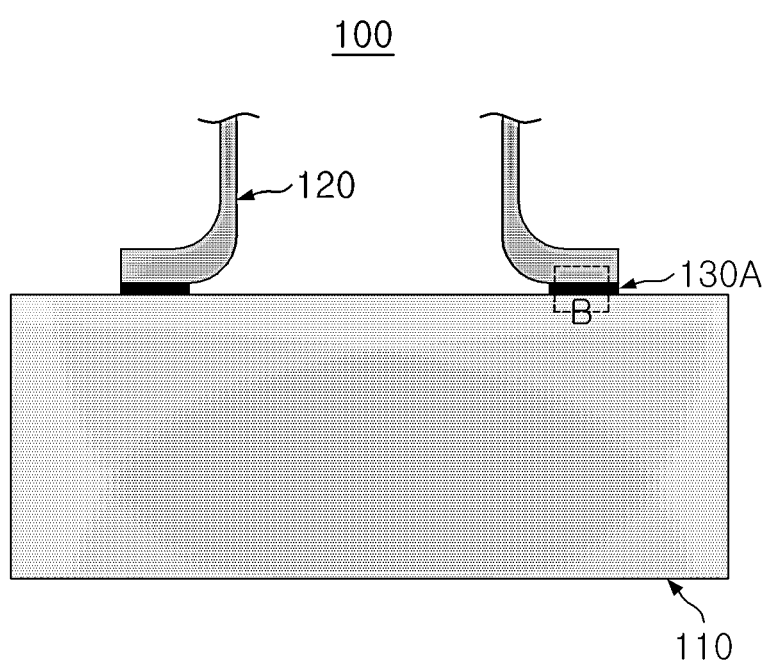
FIGS. 3A, 3B and 3C are cross-sectional views schematically showing joint structures of a susceptor according to other embodiments of the present disclosure.
Figure 3B:
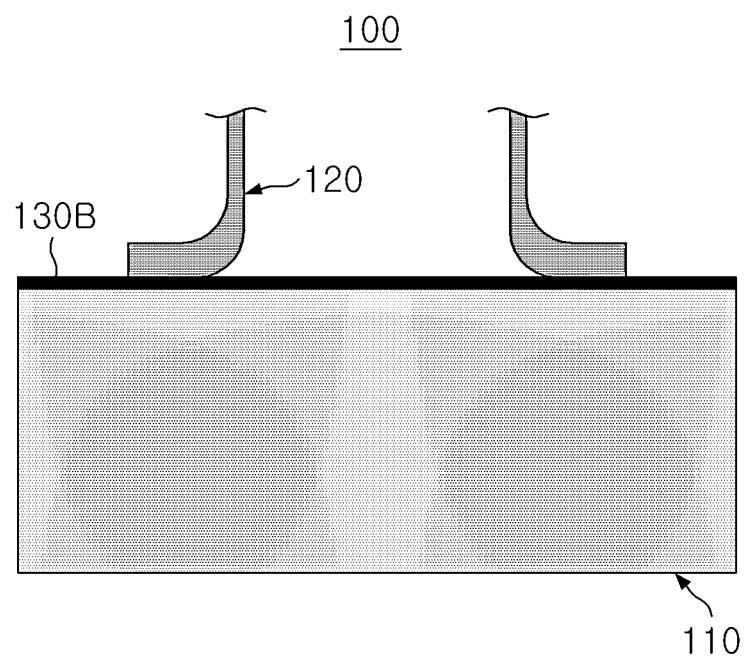
Figure 3C:
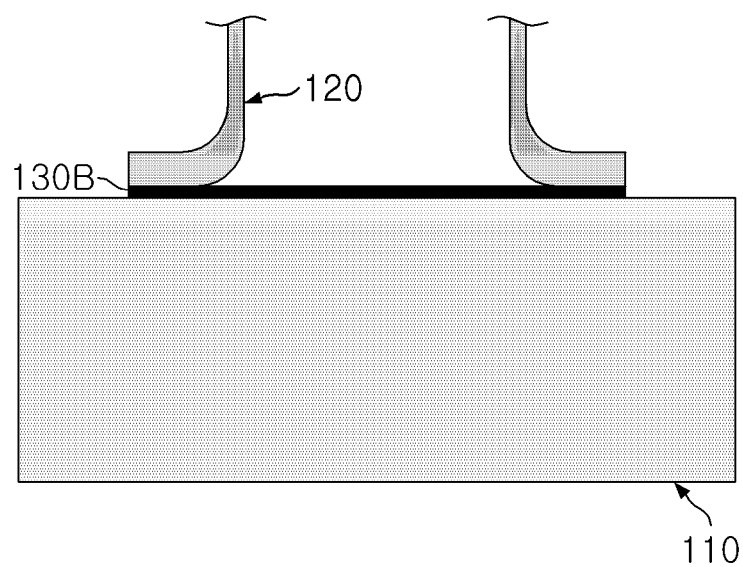

FIGS. 3A to 3C are cross-sectional views schematically showing structures of the susceptor 100 according to other embodiments of the present disclosure.

Unlike the structure of the susceptor shown in FIG. 2, the structures of the susceptor in FIGS. 3A to 3C further include buffer members 130A and 130B. In the present disclosure, the buffer members 130A and 130B may be implemented using an AlN sintered body like in the plate 110 and the shaft 120.

The buffer members 130A and 130B contain a sintering aid capable of at least locally forming a liquid phase at a sintering temperature of the AlN sintered body. For example, the sintering aid capable of forming a liquid phase may be an oxide of a rare earth element. Preferably, the sintering aid may be $Y_2O_3$. The liquid phase generated at such a sintering temperature can flow in interfaces between the buffer member and the plate and between the buffer member and the shaft to facilitate joining.

The sintered body of the buffer member 130 of the present disclosure may contain, as a sintering aid, 3 wt % or more, 3.5 wt % or more, or 4 wt % or more of a yttrium metal in terms of $Y_2O_3$. The sintered body may contain 8 wt % or less, 7 wt % or less, 6 wt % or less, or 5 wt % or less of $Y_2O_3$ as a sintering aid.

The sintered body of the buffer member of the present disclosure may contain an additional phase, such as $Y_2O_3$, YAG, YAP, or YAM, by addition of a sintering aid of a rare earth element, such as yttrium. The sintered body of the buffer member may further contain an amorphous phase existing in grain boundaries or the triple point of the AlN phase.

In the present disclosure, the buffer members 130A and 130B may have a ring shape following a shape of a contact surface of the shaft as shown in FIG. 3A or may have a circular shape as shown in FIG. 3C. Unlike this, the buffer member may have a blanket shape that follows the shape of the plate to cover the surface of the plate, as shown in FIG. 3B.

As shown in FIGS. 3A to 3C, the plate 110, the shaft 120, and the buffer members 130A and 130B all are AlN phase-based materials in the present disclosure. Therefore, the difference in coefficient of thermal expansion among these can be maximally suppressed.

Figure 4:
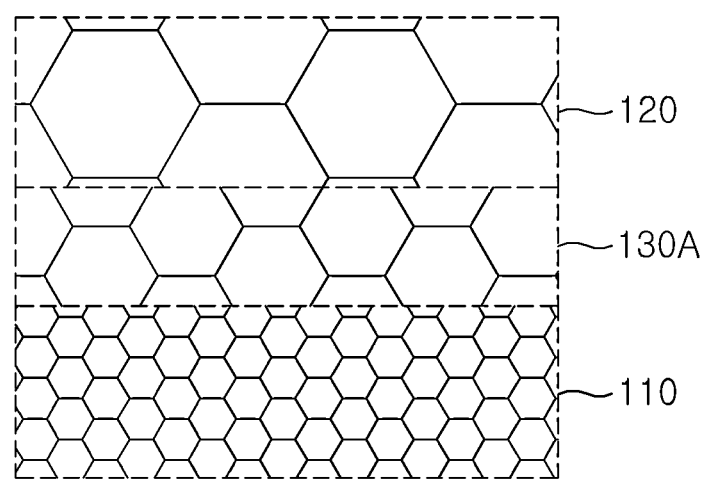
FIG. 4 is a view schematically enlarging a cross-section of a partial region of FIG. 3A.

FIG. 4 is a view schematically showing a microstructure of a sintered body near a joint part B in FIG. 3A.

As shown, the shaft 120, the buffer member 130, and the plate 110 may be composed of grains with different average particle sizes. For example, the average particle size of grains of the shaft 120 is larger than the average particle size of grains of the plate 110, and the average particle size of grains constituting the buffer member 130 preferably has a value therebetween.

Herein, the term "grain" refers to crystal grains constituting a sintered body, and may also be called "particle" according to circumstances. As used herein, the term "aluminum nitride grain" refers to a crystal grain of an AlN phase and/or an AlON phase. As described above, the AlN phase includes not only pure AlN but also one in which a trace amount of impurities is in a substitutional or interstitial solid solution in the AlN crystal structure while its AlN crystal structure is maintained. The same goes for the AlON phase.

In the present disclosure, the grain size or average particle size of grains constituting the sintered body may be calculated according to the ASTM E112 standard wherein the grain size number is determined by setting the measurement area and counting the number of grains in the area. Unlike this, the average grain size can be calculated through an analysis program through the Intercept method, Planimetric method, and Planimetric method-Classification manner by utilizing the Image Analyzer Software.

In the sintered body of the plate, the grain size of the constituent particles is preferably small for enhancement of mechanical strength at high temperatures. In the present disclosure, the shaft is sintered while a sintering aid is excluded if possible, so that a higher sintering temperature is required. Therefore, the sintered body of the shaft may have a larger grain size than the sintered body of the plate. In the present disclosure, the sintered body of the buffer member preferably has an intermediate grain size between the grain size of the sintered body of the plate and the grain size of the sintered body of the shaft.

The average particle size of grains of the shaft may be, for example, 10 µm or more, and the average particle size of grains of the plate may be 3 µm or less. The average particle size of grains of the buffer member may be 4-9 µm.

As another example, the average particle size of grains of the shaft may be for example more than 5 µm, and the average particle size of grains of the plate may be less than 1 µm. The average particle size of grains of the buffer member may be 1-5 µm. As still another example, the buffer member may have an average grain size of 5-9 µm, and the grains of the shaft may have an average particle size of 10 µm or more, and the grains of the plate may have an average particle size of 4 µm or less. In the present disclosure, the average particle size of grains of the shaft may be preferably less than 30 µm.

Although the case where the average particle size of grains of the shaft is larger than the average particle size of grains of the plate has been described so far, the present disclosure is not limited thereto. For example, the average particle size of grains of the shaft may have a smaller value than the average particle size of grains of the plate. Also, in such a case, the average particle size of grains constituting the buffer member 130 has a value between the average particle size of grains of the shaft and the average particle size of grains of the plate.

In the present disclosure, the particle size of grains of the sintered body may be, of course, controlled by varying the particle size of a start raw material.

Figure 5A:
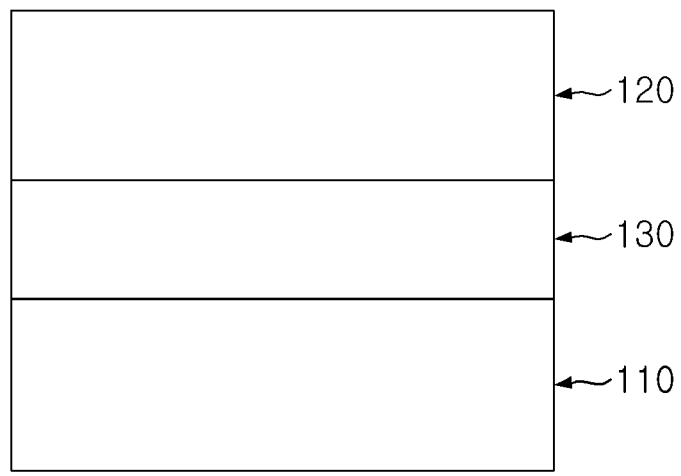
FIGS. 5A, 5B and 5C are schematic views showing various laminated structures according to embodiments of the present disclosure.
Figure 5B:
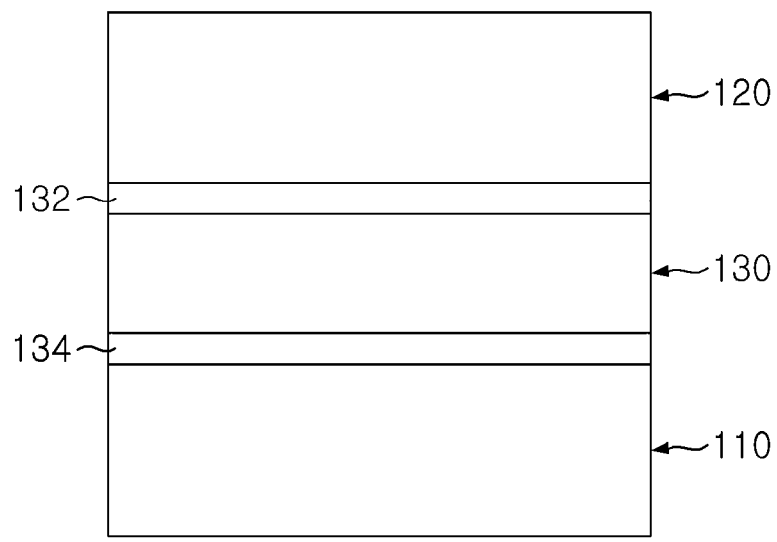
Figure 5C:
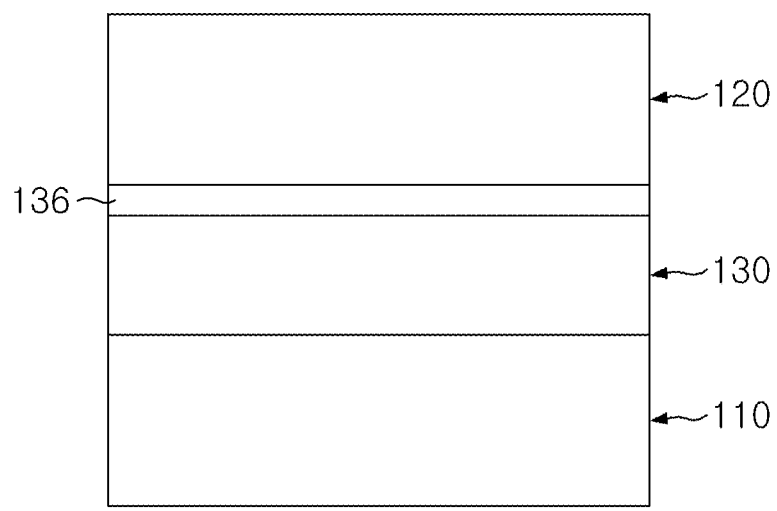

FIGS. 5A to 5C are schematic diagrams showing various embodiments of the present disclosure for manufacturing a laminated structure including a buffer member.

Referring to FIG. 5A, a buffer member 130 is disposed between a plate 110 and a shaft 120. This structure is similar to the above-described structure. The buffer member 130 may be a plate-shaped aluminum nitride sintered body. A laminated structure of plate 110/buffer 130/shaft 120 may be manufactured without an additional binder by using such a plate-shaped sintered body as described above. The laminated structure shown in FIG. 5A may be integrally formed by joining, such as hot pressing.

FIG. 5B shows a laminated structure where additional joining agent layers 132 and 134 are added between the plate 110 and the buffer member 130 and between the buffer member 130 and the shaft 120 in the laminated structure of plate 110/buffer member 130/ shaft 120. The added joining agent layers may be a ceramic binder or a ceramic paste for facilitating the joining of the plate 110/buffer member 130/ shaft 120. A susceptor may be manufactured by sintering the laminated structure as shown in FIG. 3B. In the present disclosure, the ceramic binder or ceramic paste may contain aluminum nitride as a main raw material, but is not limited thereto.

FIG. 5C shows a laminated structure of plate 110/buffer member 130/shaft 120 in which an additional joining agent layer 136 is added between the shaft 120 and the buffer member 130. The added joining agent layer may be a ceramic binder or a ceramic paste for facilitating the joining of the buffer member 130/shaft 120. According to the structures of the present embodiments, a laminated structure without a joining agent layer is first manufactured by simultaneously sintering the plate/buffer member, and the manufactured laminated structure is joined to the shaft by using a joining agent layer, thereby manufacturing a final resultant product.

The joining agent layers 132, 134, and 136 described with respect to FIGS. 5B and 5C can be coated with a very thin thickness due to the presence of the buffer member 130.

Example 1

AlN sintered bodies were manufactured at a temperature of 1700-1900° C. according to different types and contents of sintering aid. An AlN powder by Tokuyama Corporation was used as an AlN powder. The contents of the metal impurities and oxygen in the AlN powder are shown in Table 2 below.

TABLE 2

| | Impurity component | | | | |
|---|---|---|---|---|---|
| | Ca | Si | Fe | C | O |
| Content | ≤100 ppm | ≤30 ppm | ≤15 ppm | ≤600 ppm | ≤1 wt % |

The sintering aids mixed composition, the sintering temperature, and the average particle size of the sintered body in the manufactured sintered body samples are shown in Table 3.

TABLE 3

| Category | MgO | $TiO_2$ | $Y_2O_3$ | Sintering temperature (sintering method) | Average particle size (μm) |
|---|---|---|---|---|---|
| #1 | 1-3 wt % | 0.1-0.5 wt % | — | 1700-1800° C. (hot press) | ≤3 |
| #2 | 0 wt % | 0 wt % | — | 1800-1900° C. (normal pressure sintering) | 10.71 |
| #3 | — | — | 4.75 wt % | 1700-1800° C. (hot press) | 4.9 |

The volume resistance and thermal conductivity of the prepared samples were measured and shown in Table 3. The volume resistance and thermal conductivity measurement conditions were as follows.

Volume resistance: The volume resistance value, obtained by manufacturing a sintered body into a specimen with a diameter of 40 mm and a thickness of 1 mm, making electrode shapes have a main electrode diameter of 20 mm and protection electrode diameters of 32 mm (inner diameter) and 38 mm (outer diameter), setting an applied voltage to 100 V/mm on the basis of an applied electric field, and keeping the voltage application time for 60 seconds, was recorded.

Thermal conductivity measurement method: The coefficient of thermal diffusion of a sintered body was calculated by a laser flash method. The thermal conductivity was derived by the equation, "density×specific heat×coefficient of diffusion=thermal conductivity (W/mK)" by means of the calculated coefficient of thermal diffusion.

TABLE 4

| Category | Volume resistance @RT (Ωcm) | Volume resistance @550° C. (Ωcm) | Volume resistance @650° C. (Ωcm) | Thermal conductivity (@RT, W/mK) |
|---|---|---|---|---|
| #1 | $4 * 10^{15}$ | $3 * 10^{11}$ | $6 * 10^9$ | 67 |
| #2 | $8 * 10^{13}$ | $5 * 10^7$ | $3 * 10^6$ | 84 |
| #3 | $3 * 10^{15}$ | $1 * 10^9$ | $8 * 10^7$ | 176 |

Example 2

A molded body was prepared from a mixed raw material powder having composition #1 in Example 1. On the molded body, a molded body formed of a mixed raw material powder having composition #3 in Example 1 was laminated. The laminated molded bodies were sintered by a hot press at a temperature of 1700-1800° C.

Figure 6:
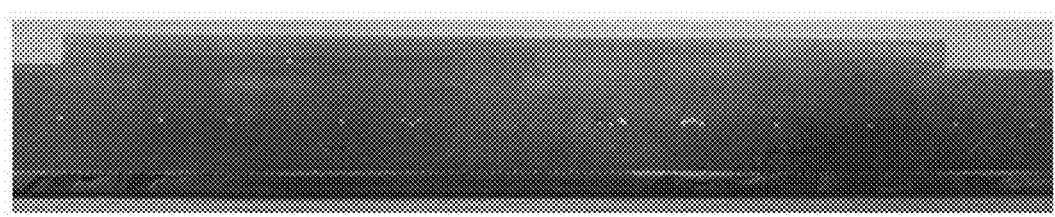
FIG. 6 is an image obtained by photographing a cross-section of a laminated and joined body manufactured according to an embodiment of the present disclosure.

FIG. 6 is a view showing a cross-section of the sintered body. The image of FIG. 6 shows a heating element and a mesh electrode embodied inside a plate below.

Example 3

In the sintered body with a laminated structure manufactured in Example 2, a joining agent paste was coated with a thickness of 60 μm (range: 50-70 μm) on the surface of a $Y_2O_3$-containing sintered body. The joining agent paste used a composition in which $Al_2O_3$, CaO, and $Y_2O_3$ were added in the AlN base.

Figure 7:
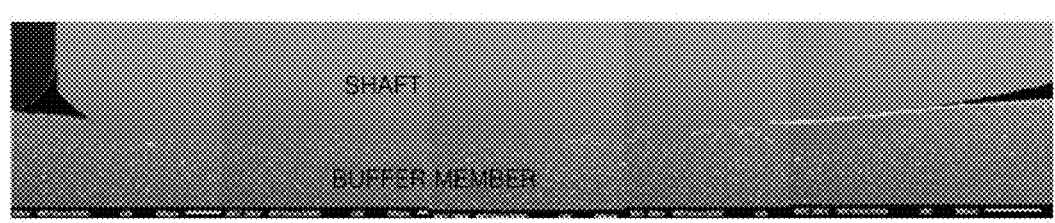
FIG. 7 is a cross-sectional view obtained by photographing a joint interface of a laminated and joined body manufactured according to an embodiment of the present disclosure.

A sintered body with low thermal conductivity of a shaft was laminated on the surface on which the joining agent was coated, and then a joining process was performed while a laminated site was compressed by a separate jig. The joining process was performed at a temperature of 1650° C.-1780° C. FIG. 7 is a cross-sectional image obtained by photographing the joint interface of the manufactured laminated and joined body.

The specified matters and limited exemplary embodiments and drawings such as specific elements in the present invention have been disclosed for broader understanding of the present invention, but the present invention is not limited to the exemplary embodiments, and various modifications and changes are possible by those skilled in the art without departing from an essential characteristic of the present invention. Therefore, the spirit of the present invention is defined by the appended claims rather than by the description preceding them, and all changes and modifications that fall within metes and bounds of the claims, or equivalents of such metes and bounds are therefore intended to be embraced by the range of the spirit of the present invention.

What is claimed is:

1. A susceptor comprising a plate for wafer mounting, a shaft coupled to the plate, and a buffer member interposed between the shaft and the plate,
   wherein the plate, the shaft, and the buffer member each comprise a sintered body having 90 wt % or more of an AlN phase,
   wherein the sintered body of the plate is a magnesium-containing AlN sintered body having a thermal conductivity of 50-80 W/mK at room temperature and a thermal conductivity of 20-50 W/mK at 650° C., and having a volume resistance of $5*10^8$ Ω·cm or more at 650° C.,
   wherein the sintered body of the shaft is an AlN sintered body having a room-temperature thermal conductivity of 100 W/mK or less, and a content of an individual metal element in the sintered body of the shaft is at 1000 ppm or less, wherein the buffer member contains 3-8 wt % of yttrium in terms of $Y_2O_3$ and has a thermal conductivity of 160-190 W/m·K at room temperature, wherein the sintered body of the plate contains 0.5-3.0 wt % of magnesium in terms of MgO and 0.05-0.5 wt % of titanium in terms of $TiO_2$, and wherein when the average particle sizes of AlN grains in the sintered bodies of the plate, buffer member, and shaft are a first average particle size, a second average particle size, and a third average particle size, respectively, a relationship is established in which the second average particle size is larger than the first average particle size, and the third average particle size is larger than the second average particle size.

2. The susceptor of claim 1, wherein the buffer member has a blanket, ring, or circle shape.

3. A method for manufacturing a susceptor, the method comprising:

providing a laminated structure with a plate of a magnesium-containing AlN sintered body, a buffer member of an yttrium-containing AlN pre-sintered or sintered body, and a shaft of an AlN sintered body having a thermal conductivity of 100 W/mK or less; and sintering the laminated structure, wherein the plate, the shaft, and the buffer member each comprise a sintered body having 90 wt % or more of an AlN phase, wherein the sintered body of the plate contains 0.5-3.0 wt % of magnesium in terms of MgO and 0.05-0.5 wt % of titanium in terms of $TiO_2$, and the sintered body of the plate has a thermal conductivity of 50-80 W/mK at room temperature and a thermal conductivity of 20-50 W/mK at 650° C., and has a volume resistance of $5*10^8$ Ω·cm or more at 650° C., and a content of an individual metal element in the sintered body of the shaft is at 1000 ppm or less, wherein the buffer member contains the buffer member contains 3-8 wt % of yttrium in terms of $Y_2O_3$ and has a thermal conductivity of 160-190 W/m·K at room temperature, and wherein in the providing of the laminated structure, when the average particle sizes of AlN grains in the sintered bodies of the plate, buffer member, and shaft are a first average particle size, a second average particle size, and a third average particle size, respectively, a relationship is established in which the second average particle size is larger than the first average particle size, and the third average particle size is larger than the second average particle size.

4. The method of claim 3, wherein in the providing of the laminated structure, the buffer member is an AlN sintered body and the plate and the buffer member are provided in an integrally sintered state.

5. The method of claim 3, wherein in the providing of the laminated structure, the buffer member contains 3-8 wt % of yttrium in terms of yttrium oxide.

* * * * *